(12) United States Patent
Arai et al.

(10) Patent No.: US 6,676,491 B2
(45) Date of Patent: Jan. 13, 2004

(54) SEMICONDUCTOR WAFER DIVIDING METHOD

(75) Inventors: Kazuhisa Arai, Tokyo (JP); Masaya Takeuchi, Tokyo (JP); Hiromi Hayashi, Tokyo (JP); Hideyuki Sando, Tokyo (JP)

(73) Assignee: Disco Corporation, Tokyo (JP)

( * ) Notice: Subject to any disclaimer, the term of this patent is extended or adjusted under 35 U.S.C. 154(b) by 30 days.

(21) Appl. No.: 10/177,111

(22) Filed: Jun. 24, 2002

(65) Prior Publication Data

US 2003/0013380 A1 Jan. 16, 2003

(30) Foreign Application Priority Data

Jun. 28, 2001 (JP) ........................................ 2001-197308

(51) Int. Cl.[7] .............................................. B24B 49/00
(52) U.S. Cl. ...................... 451/57; 125/13.01; 438/460
(58) Field of Search ........................... 125/13.01, 23.01, 125/14; 451/57, 8, 6, 10; 438/460, 68; 148/DIG. 28

(56) References Cited

U.S. PATENT DOCUMENTS

| | | | | |
|---|---|---|---|---|
| 5,219,796 A | * | 6/1993 | Quinn et al. | 438/68 |
| 5,369,060 A | * | 11/1994 | Baumann et al. | 438/460 |
| 5,888,883 A | * | 3/1999 | Sasaki et al. | 438/460 |
| 6,083,811 A | * | 7/2000 | Riding et al. | 438/460 |
| 6,293,270 B1 | * | 9/2001 | Okazaki | 125/13.01 |
| 6,500,047 B2 | * | 12/2002 | Arai et al. | 451/14 |
| 6,558,975 B2 | * | 5/2003 | Sugino et al. | 438/68 |

* cited by examiner

Primary Examiner—Robert A. Rose
(74) Attorney, Agent, or Firm—Smith, Gambrell & Russell, LLP

(57) ABSTRACT

A semiconductor wafer dividing method for dividing a semiconductor wafer, in which a plurality of rectangular regions are demarcated by streets arranged in a lattice pattern on the face of the semiconductor wafer, and a semiconductor circuit is disposed in each of the rectangular regions, into the individual rectangular regions. This method includes a groove cutting step of cutting the face of the semiconductor wafer along the streets to form grooves along the streets on the face of the semiconductor wafer, and a back grinding step of grinding the back of the semiconductor wafer to reduce the thickness of the semiconductor wafer to not more than the depth of the grooves, thereby dividing the semiconductor wafer along the streets. This method further includes, before the back grinding step, a groove depth measuring step of measuring the depth of the grooves. In the back grinding step, rough grinding is performed until the thickness of the semiconductor wafer becomes greater than the depth of the grooves by a predetermined value, and then precision grinding is performed until the thickness of the semiconductor wafer becomes not more than the depth of the grooves.

5 Claims, 4 Drawing Sheets

SEMICONDUCTOR WAFER DIVIDING METHOD

FIELD OF THE INVENTION

This invention relates to a semiconductor wafer dividing method for dividing a semiconductor wafer, in which a plurality of rectangular regions are demarcated by streets arranged in a lattice pattern on the face of the semiconductor wafer, and a semiconductor circuit is disposed in each of the rectangular regions, into the individual rectangular regions.

DESCRIPTION OF THE PRIOR ART

For production of a semiconductor chip, as is well known among people skilled in the art, it is common practice to demarcate a plurality of rectangular regions by streets arranged in a lattice pattern on the face of a semiconductor wafer to form a semiconductor circuit in each of the rectangular regions. The thickness of the semiconductor wafer is sufficiently decreased, and the semiconductor wafer is divided into the individual rectangular regions, whereby semiconductor chips are produced. A customary mode of decreasing the thickness of a semiconductor wafer and dividing the semiconductor wafer into the individual rectangular regions comprises grinding the back of the semiconductor wafer to impart a required thickness to the semiconductor wafer, and then cutting the semiconductor wafer along the streets to form the individual rectangular regions. Instead of this customary mode, a mode, called dicing-before-grinding, has recently been proposed and put to practical use. According to the dicing-before-grinding mode, a semiconductor wafer is cut along streets to a predetermined depth, rather than over the full thickness of the semiconductor wafer, to form grooves along the streets on the face of the semiconductor wafer, and then the back of the semiconductor wafer is ground to make the thickness of the semiconductor wafer not more than the depth of the grooves, for example, about 50 μ, thereby dividing the semiconductor wafer into individual rectangular regions. Grinding of the back of the semiconductor wafer is carried out by rough grinding at a relatively high speed with the use of rough grinding means containing relatively large diamond grains, followed by precision grinding at a relatively low speed with the use of precision grinding means containing relatively small diamond grains. From the point of view of the grinding efficiency, it is desired that the thickness ground by rough grinding be maximized, while the thickness ground by precision grinding be made a minimum required value.

The aforementioned conventional semiconductor wafer dividing method, called dicing-before-grinding, poses the following problems to be solved: The depth of the grooves formed on the face of the semiconductor wafer tends to fluctuate, although slightly, owing to abrasion of the cutting means caused by repeated cutting, and fluctuations in ambient temperature at which cutting is performed. Because of the fluctuations in the depth of the grooves, even when the semiconductor wafer is brought to a predetermined thickness by grinding the back of the semiconductor wafer, there may be cases in which the depth of the grooves is smaller than the thickness of the semiconductor wafer, accordingly, the rectangular regions are not divided individually. Alternatively, while the back of the semiconductor wafer is being ground roughly, the thickness of the semiconductor wafer may become not more than the depth of the grooves, with the result that the rectangular regions may be divided individually before precision grinding is performed. If the. semiconductor wafer is divided into the individual rectangular regions prior to precision grinding, the rough grinding means acts on the edges of the individual rectangular regions, i.e., semiconductor chips, so that intolerable chipping often occurs in the edges of the semiconductor chips. Furthermore, the back of the semiconductor chips is not sufficiently smooth.

SUMMARY OF THE INVENTION

A principal object of the present invention is to improve the semiconductor wafer dividing method, called dicing-before-grinding, thereby making it possible to divide a semiconductor wafer into individual rectangular regions sufficiently satisfactorily, without posing intolerable problems, even if the depth of grooves formed on the face of the semiconductor wafer slightly fluctuates.

The inventors of the present invention conducted in-depth studies, and have found that the above-mentioned principal object can be attained by measuring the depth of grooves formed on the face of a semiconductor wafer before grinding the back of the semiconductor wafer, for example, whenever a predetermined number of the semiconductor wafers are to be divided, and then controlling rough grinding and precision grinding during the grinding step in accordance with the depth of the grooves measured.

According to the present invention, there is provided, as a semiconductor wafer dividing method which attains the aforementioned principal object, a semiconductor wafer dividing method for dividing a semiconductor wafer, in which a plurality of rectangular regions are demarcated by streets arranged in a lattice pattern on the face of the semiconductor wafer, and a semiconductor wafer is disposed in each of the rectangular regions, into the individual rectangular regions, comprising:

a groove cutting step of cutting the face of the semiconductor wafer along the streets to form grooves along the streets on the surface of the semiconductor wafer; and a back grinding step of grinding the back of the semiconductor wafer to reduce the thickness of the semiconductor wafer to not more than the depth of the grooves, thereby dividing the semiconductor wafer along the streets, and wherein:

a groove depth measuring step of measuring the depth of the grooves is incorporated before the back grinding step; and in the back grinding step, rough grinding is performed until the thickness of the semiconductor wafer becomes greater than the depth of the grooves by a predetermined value, and then precision grinding is performed until the thickness of the semiconductor wafer becomes not more than the depth of the grooves.

The groove depth measuring step preferably includes measurement of the full thickness of the semiconductor wafer before or after the groove cutting step, measurement of the remaining thickness of the semiconductor wafer at the groove after the groove cutting step, and calculation of the depth of the grooves by subtracting the remaining thickness from the full thickness. The measurement of the full thickness of the semiconductor wafer can be made advantageously by back pressure measuring means. The measurement of the remaining thickness of the semiconductor wafer at the groove can be made advantageously by laser light reflection measuring means. Preferably, a tape application step of applying a protective tape onto the face of the semiconductor wafer is incorporated after the groove cutting step and the groove depth measuring step.

DETAILED DESCRIPTION OF THE PREFERRED EMBODIMENTS

Preferred embodiments of a semiconductor wafer dividing method according to the present invention will be described in detail by reference to the accompanying drawings.

Figure 1:
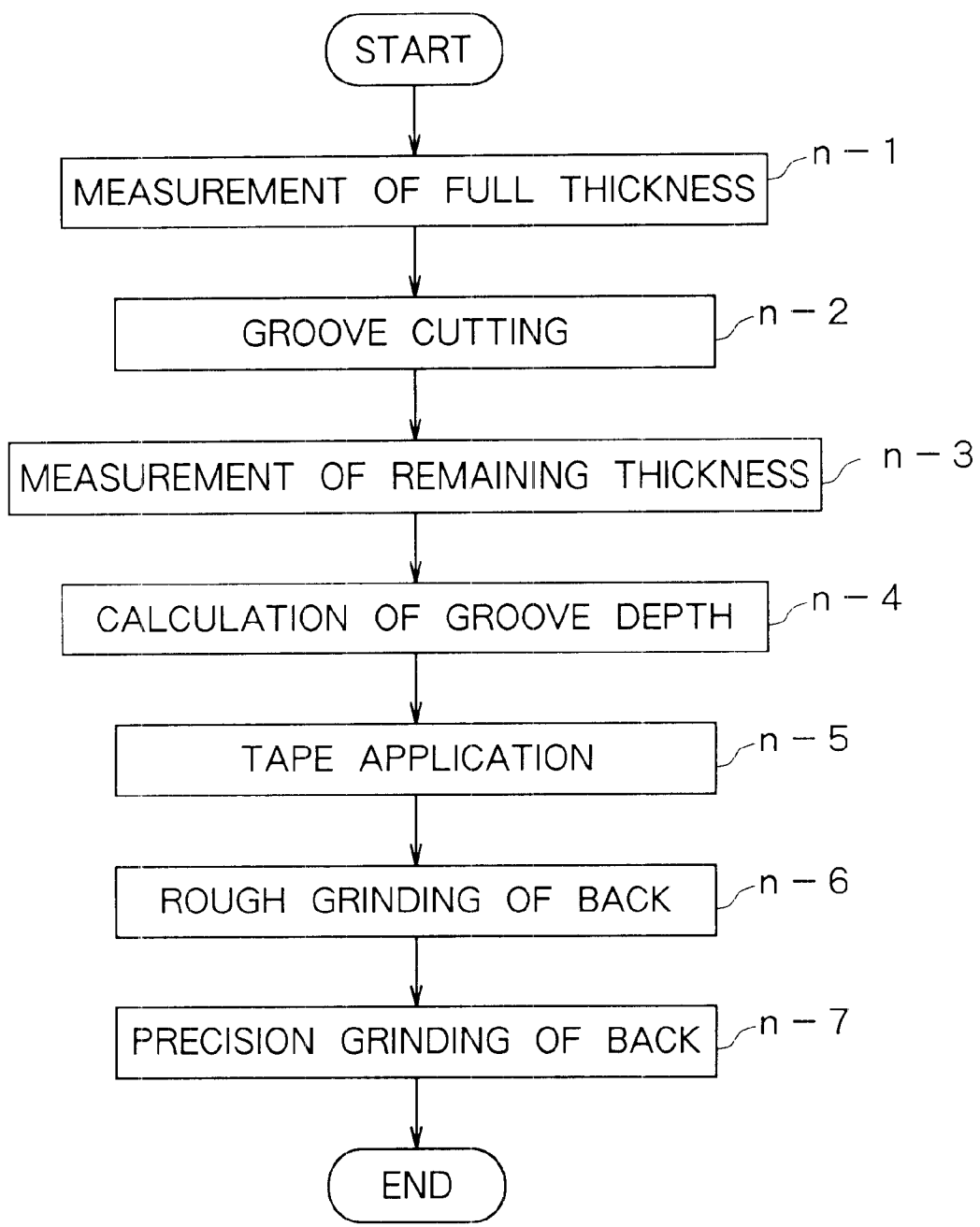
FIG. 1 is a flow chart showing process steps in a preferred embodiment of a semiconductor wafer dividing method according to the present invention.
Figure 2:
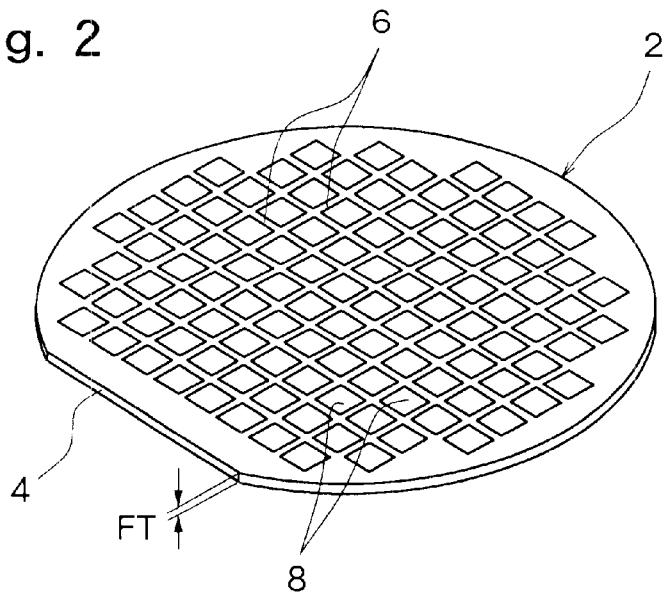
FIG. 2 is a perspective view showing an example of a semiconductor wafer.

FIG. 1 shows process steps in a preferred embodiment of the semiconductor wafer dividing method according to the present invention. In Step n-1, the full thickness FT of a semiconductor wafer 2 (FIG. 2) is measured. As shown in FIG. 2, the semiconductor wafer 2, such as a silicon wafer, is nearly disk-shaped overall, and a straight edge 4, called an orientation flat, is formed in a part of its peripheral edge. Streets 6 are arranged in a lattice pattern on the face of the semiconductor wafer 2, and many rectangular regions 8 are demarcated by these streets 6. A suitable semiconductor circuit is disposed in each of the rectangular regions 8.

Figure 3:
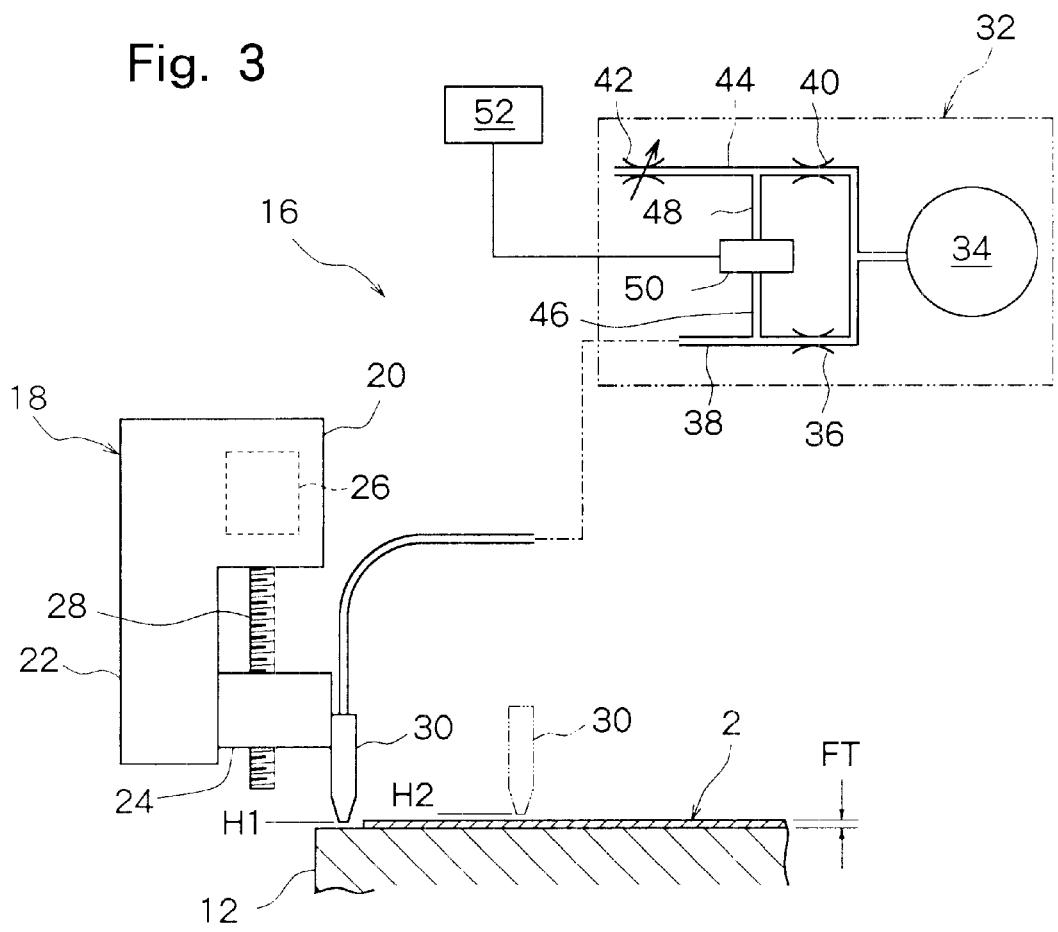
FIG. 3 is a schematic view showing a preferred mode of measuring the full thickness.

FIG. 3 shows a preferred mode of measuring the full thickness FT of the semiconductor wafer 2. The semiconductor wafer 2 is placed faceup on a chuck plate 12. The chuck plate 12 is mounted so as to be movable in a right-and-left direction in FIG. 3 and in a direction perpendicular to the sheet face of the drawing, and so as to be rotatable about a central axis extending substantially vertically. At least a part of the chuck plate 12 is porous, or suction grooves and holes of suitable shapes are formed in the chuck plate 12. Suction through the chuck plate 12 by a suitable vacuum source causes the semiconductor wafer 2 to be attracted onto and held on the chuck plate 12. The full thickness FT of the semiconductor wafer 2 so attracted onto and held on the chuck plate 12 is measured with measuring means 16. The measuring means 16 is preferably back pressure measuring means, called a pneumatic micrometer.

FIG. 3 is referred to for a more detailed explanation for the measuring means 16. The measuring means 16 includes a case 18 fixed at a required position, and the case 18 has a hollow upper portion 20 and a downward extension 22 extending downwardly from a one-side part of the hollow upper portion 20. An up-and-down block 24 is mounted on the downward extension 22 upwardly and downwardly movably. A pulse motor 26 is mounted in the hollow upper portion 20, and a threaded shaft 28 extending substantially vertically in a downward direction is connected to an output shaft of the motor 26. An internally threaded hole, as a through-hole extending substantially vertically, is formed in the up-and-down block 24, and the threaded shaft 28 is screwed into the internally threaded hole. Thus, when the threaded shaft 28 is rotated in normal and reverse directions by the motor 26, the up-and-down block 24 is raised and lowered. A nozzle 30 is fixed to the up-and-down block 24. The nozzle 30 disposed substantially vertically has an ejection port at its lower end. The motor 26 is equipped with nozzle movement amount detection means (not shown) for detecting the amounts of normal and reverse rotations of the motor, accordingly, the amounts of ascent and descent of the nozzle 30 fixed to the up-and-down block 24.

As schematically shown in FIG. 3, a pneumatic bridge circuit 32 is connected to the nozzle 30. The pneumatic bridge circuit 32, well known per se, includes a compressed air source 34, a channel 38 having fixed restriction means 36, and a channel 44 having fixed restriction means 40 and variable restriction means 42. The channel 38 makes the compressed air source 34 communicate with the nozzle 30, while the channel 44 makes the compressed air source 34 communicate with the atmosphere. The pneumatic bridge circuit 32 further includes a differential pressure gauge 50 which is brought into communication with the channel 38 by a channel 46 and which is brought into communication with the channel 44 by a channel 48. Compressed air, supplied to the nozzle 30 via the channel 38, is jetted toward a target material (i.e., chuck plate 12 and semiconductor wafer 2) through the ejection port of the nozzle 30. The outlet resistance of the compressed air through the nozzle 30 varies with the distance between the nozzle 30 and the target material. Thus, the differential pressure between the pressure in the channel 38 and the pressure in the channel 44 varies with the distance between the nozzle 30 and the target material. The differential pressure gauge 50 outputs a voltage responsive to the differential pressure between the pressure in the channel 38 and the pressure in the channel 44, so that a voltmeter 52 connected to the differential pressure gauge 50 varies with the distance between the nozzle 30 and the target material. For details of the back pressure measuring means 16 per se which has the pneumatic bridge circuit 32, reference is requested, for example, to Japanese Utility Model Publication No. 29446/1995.

According to a mode of measuring the full thickness of the semiconductor wafer 2 by the back pressure measuring means 16, as initially indicated by solid lines in FIG. 3, a site of the chuck plate 12 which is not covered with the semiconductor wafer 2 (this site is free from holes and grooves, but is solid and has a flat surface) is opposed to the ejection hole of the nozzle 30. Compressed air is ejected through the nozzle 30, and the position H1 of the nozzle 30 and the voltage of the voltmeter 52 at this time are stored. Then, the chuck plate 12 is moved in the horizontal direction, whereby the face of the semiconductor wafer 2 held on the chuck plate 12 is opposed to the nozzle 30, as shown by two-dot chain lines in FIG. 3 (for convenience of illustration, not the chuck plate 12, but the nozzle 30 is moved in FIG. 3). The nozzle 30 is moved upward and downward, with compressed air being ejected through the nozzle 30, and there is stored the position H2 of the nozzle 30 at which the voltage presented by the voltmeter 52 coincides with the previously stored voltage. From the position H1 and the position H2, the full thickness FT of the semiconductor wafer 2 is calculated by FT=H2−H1.

Figure 4:
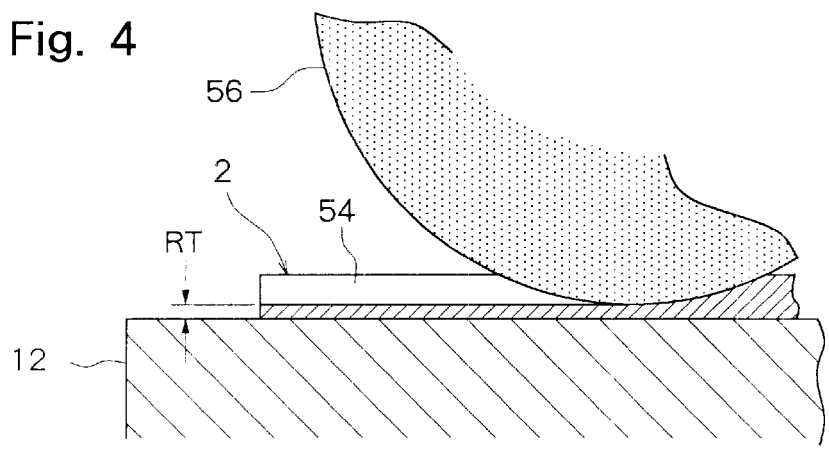
FIG. 4 is a schematic view showing a preferred mode of groove cutting.

In Step n-2 (groove cutting step), cutting is performed along the streets 6 arranged on the face of the semiconductor wafer 2 to form grooves 54 along the streets 6 on the face of the semiconductor wafer 2. FIG. 4 shows a preferred example of the groove cutting step. In the illustrated groove cutting step, a cutting blade 56 in the shape of a thin disk is positioned at a required height relative to the semiconductor wafer 2, and the cutting blade 56 is rotated at a high speed. At the same time, the semiconductor wafer 2 held on the chuck plate 12 is horizontally moved along the streets 6 relative to the cutting blade 56. As a result, the semiconductor wafer 2 is cut along the streets 6 not over its full thickness, but partially. As the cutting blade 56, a so-called diamond blade formed by binding diamond grains with a nickel plating or a suitable binder can be used preferably. An example of a device, which is preferred for forming the grooves 54 in the semiconductor wafer 2 with the use of the cutting blade 56, is a dicer sold by Disco Corporation, Japan, under the trade name of "DFD Series". Since the method and device for forming the grooves 54 along the streets 6 on the face of the semiconductor wafer 2 are well known among people skilled in the art, their detailed descriptions are omitted herein. After the face of the semiconductor wafer 2 is cut with the cutting blade 56 to form the grooves 54, a cleaning fluid, optionally compressed air or pure water, is jetted at the face of the semiconductor wafer 2, especially the resulting grooves 54, whereby swarf is removed from the face of the semiconductor wafer 2.

In the process steps shown in FIG. 1, the full thickness of the semiconductor wafer 2 is measured prior to the groove cutting step. If desired, the full thickness FT of the semiconductor wafer 2 (i.e., the thickness at the site where the grooves 54 are not formed) can be measured after the groove cutting step is performed.

Figure 5:
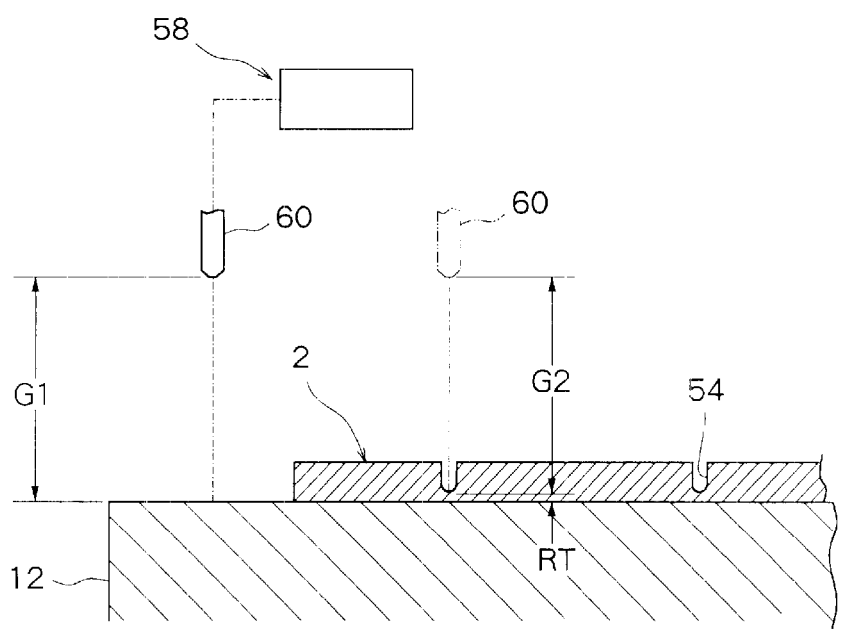
FIG. 5 is a schematic view showing a preferred mode of measuring the remaining thickness.

Then, in Step n-3, the remaining thickness RT at the groove 54 formed in the semiconductor wafer 2 is measured. FIG. 5 shows a preferred mode of measuring the remaining thickness RT at the groove 54. The semiconductor wafer 2 is held on the chuck plate 12, with its face having the groove 54 being directed upward. Laser measuring means 58 is used for measuring the remaining thickness RT at the groove 54 of the semiconductor wafer 2. The laser measuring means 58 has a transmitting/receiving head 60 located opposite the target material (i.e., chuck plate 12 and the site of formation of the groove 54 in the semiconductor wafer 2). The laser measuring means 58 transmits a laser from the head 60 to the target material, receives the laser reflected by the target material into the head 60, measures the time from transmission until reception, and determines the distance between the head 60 and the target material based on this time. A preferred example of the laser measuring means 58 is laser measuring means sold by Mitaka Koki Kabushiki Kaisha, Japan, under the trade name of "NH Series".

According to a mode of measuring the remaining thickness RT of the semiconductor wafer 2 at the groove 54 by the laser measuring means 58, as initially indicated by solid lines in FIG. 5, a site of the chuck plate 12 which is not covered with the semiconductor wafer 2 (this site is free from holes and grooves, but is solid and has a flat surface) is opposed to the head 60. The distance G1 between the head 60 and the surface of the chuck plate 12 is measured. Then, the chuck plate 12 is moved in the horizontal direction, whereby the groove 54 of the semiconductor wafer 2 held on the chuck plate 12 is opposed to the head 60, as shown by two-dot chain lines in FIG. 5 (for convenience of illustration, not the chuck plate 12, but the head 60 is moved in FIG. 5). Then, the distance G2 between the head 60 and the bottom of the groove 54 is measured. From the distance G1 and the distance G2, the remaining thickness RT at the groove 54 is calculated by RT=G1−G2.

FIG. 1 is referred to again for explanation. In Step n-4, the depth D of the groove 54 is calculated by the following equation from the full thickness FT measured in Step n-1 and the remaining thickness RT measured in Step n-3: D=FT−RT. In the illustrated embodiments, therefore, Step n-1, Step n-3 and Step n-4 constitute a groove depth measuring step. If desired, the distance between the head 60 and the face of the semiconductor wafer 2, and the distance between the head 60 and the bottom of the groove 54 can be measured, for example, with the use of the laser measuring means 58 shown in FIG. 5, and the depth of the groove 54 can be calculated from these values. However, if a transparent or semitransparent layer is present on the face of the semiconductor wafer 2, the distance between the head 60 and the face of the semiconductor wafer 2 cannot be measured, because the laser transmitted from the head 60 passes through the transparent or semitransparent layer.

Figure 6:
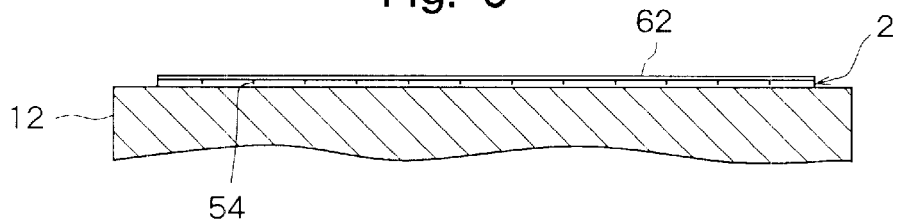
FIG. 6 is a sectional view showing a state of a tape applied to the face of the semiconductor wafer.

In Step n-5, a tape application step is carried out. In this tape application step, a protective tape 62, which may be a suitable plastic tape, is applied onto the face of the semiconductor wafer 2 having the grooves 54, as shown in FIG. 6. The tape application step can be performed using a suitable tape applicator (not shown) well known among people skilled in the art.

Figure 7:
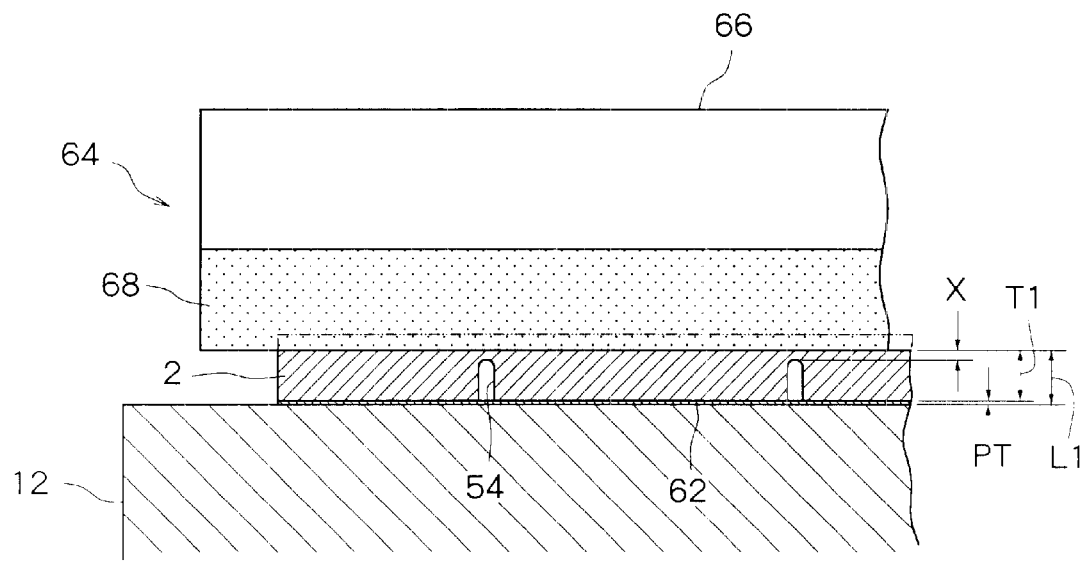
FIG. 7 is a schematic view showing a preferred mode of rough grinding of the back of the semiconductor wafer.

Then, in Step n-6, the back of the semiconductor wafer 2 is subjected to rough grinding. FIG. 7 shows a preferred mode of the rough grinding. In the illustrated mode, the semiconductor wafer 2, which has the protective tape 62 applied to the face thereof, is held on the chuck plate 12, with the face and back of the semiconductor wafer 2 being inverted, namely, its face bearing the protective tape 62 being directed downward, and its back to be ground being directed upward. The back of the semiconductor wafer 2 is acted on by rough grinding means 64, and rough ground thereby. The rough grinding means 64 is composed of a rough grinding tool including an annular support member 66 and a plurality of arcuate rough grinding pieces 68 disposed on the lower surface of the support member 66. Instead of the plurality of arcuate rough grinding pieces 68, an annular rough grinding piece extending continuously in a circumferential direction may be disposed on the lower surface of the support member 66. The rough grinding piece 68 is preferably formed by binding relatively large diamond grains with the use of a suitable binder. In rough grinding the back of the semiconductor wafer 2, the rough grinding means 64 is rotated at a high speed about its central axis. At the same time, the chuck plate 12 is rotated at a required speed about its central axis, and accordingly, the semiconductor wafer 2 held on the chuck plate 12 is rotated at the required speed. During this action, the rough grinding means 64 is gradually lowered. An example of a device, which is advantageous for grinding the back of the semiconductor wafer 2 with the use of the rough grinding means 64, is a grinder sold by Disco Corporation, Japan, under the trade name of "DFG Series".

Descent of the rough grinding means 64 when rough grinding the back of the semiconductor wafer 2 is controlled based on the depth D of the groove 54 calculated in Step n-4. The thickness T1 of the semiconductor wafer 2 having the back rough ground is made greater than the depth D of the groove 54 by a predetermined value X. Thus, the rough grinding means 64 is lowered until the distance L1 between the lower surface of the rough grinding means 64 and the surface of the chuck plate 12 becomes the sum of the thickness PT of the protective tape 62, the depth D of the groove 54, and the predetermined value X (i.e., L1=PT+D+X). The predetermined value X is preferably about 5 to 20 μm.

Figure 8:
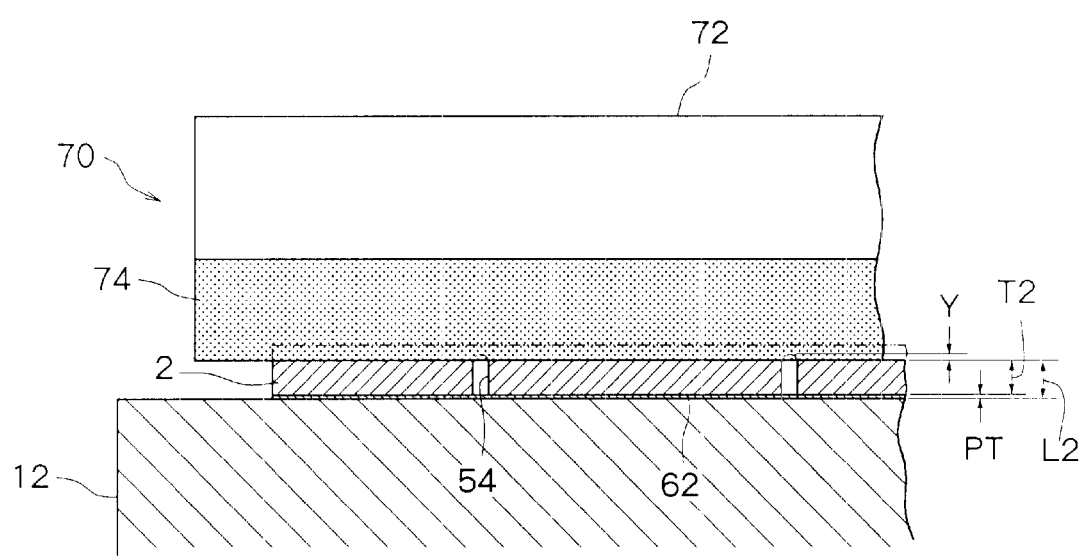
FIG. 8 is a schematic view showing a preferred mode of precision grinding of the back of the semiconductor wafer.

Then, in Step n-7, the rough ground back of the semiconductor wafer 2 is subjected to precision grinding. FIG. 8 shows a preferred mode of the precision grinding. The illustrated mode of precision grinding is substantially the same as the mode of rough grinding shown in FIG. 7, except that grinding pieces disposed on the lower surface of a support member 72 in precision grinding means 70 used are precision grinding pieces 74. The precision grinding piece 74 is preferably formed by binding relatively small diamond grains with the use of a suitable binder.

Descent of the precision grinding means 70 when precision grinding the back of the semiconductor wafer 2 is also controlled based on the depth D of the groove 54 calculated in Step n-4. The thickness T2 of the semiconductor wafer 2 having the back precision ground is made substantially equal to, or smaller by a predetermined value Y than, the depth D of the groove 54. Thus, the precision grinding means 70 is lowered until the distance L2 between the lower surface of the precision grinding means 70 and the surface of the chuck plate 12 becomes substantially equal to the sum of the thickness PT of the protective tape 62 and the depth D of the groove 54 (i.e., L2=PT+D), or becomes smaller than this sum by the predetermined value Y (i.e., L2=PT+D−Y). The predetermined value Y is preferably about 10 μm or less.

When the thickness T2 of the semiconductor wafer 2 is made substantially equal to, or smaller by the predetermined value Y than, the depth D of the groove 54, the semiconductor wafer 2 is separated into the individual rectangular regions 8. However, the common protective tape 62 has been applied to the surface of each individual rectangular region 8, the individual rectangular regions 8 are connected with each other via the protective tape 62 even after precision grinding. After the precision grinding, the individually separated rectangular regions 8 are individually peeled from the protective tape 62, and transported as semiconductor chips to a required site, as this is well known among people skilled in the art.

The aforementioned Steps n-1 (measurement of the full thickness), n-3 (measurement of the remaining thickness), and n-4 (calculation of the groove depth) need not to be performed for all the semiconductor wafers 2. For example, these steps can be performed once every time the aforementioned Steps n-2 (groove cutting), n-5 (tape application), n-6 (rough grinding of the back), and n-7 (precision grinding of the back) are carried out for 50 of the semiconductor wafers 2.

The preferred embodiments of the semiconductor wafer dividing method according to the present invention have been described in detail with reference to the accompanying drawings. However, it is to be understood that the present invention is not limited to these embodiments, but various changes and modifications may be made without departing from the spirit and scope of the invention.

What we claim is:

1. A semiconductor wafer dividing method for dividing a semiconductor wafer, in which a plurality of rectangular regions are demarcated by streets arranged in a lattice pattern on a face of the semiconductor wafer, and a semiconductor circuit is disposed in each of the rectangular regions, into the individual rectangular regions, comprising:

a groove cutting step of cutting the face of the semiconductor wafer along the streets to form grooves along the streets on the face of the semiconductor wafer; and a back grinding step of grinding a back of the semiconductor wafer to reduce a thickness of the semiconductor wafer to not more than a depth of the grooves, thereby dividing the semiconductor wafer along the streets, and wherein:

a groove depth measuring step of measuring the depth of the grooves is incorporated before the back grinding step; and in the back grinding step, rough grinding is performed until the thickness of the semiconductor wafer becomes greater than the depth of the grooves by a predetermined value, and then precision grinding is performed until the thickness of the semiconductor wafer becomes not more than the depth of the grooves.

2. The semiconductor wafer dividing method of claim 1, wherein the groove depth measuring step includes measurement of a full thickness of the semiconductor wafer before or after the groove cutting step, measurement of a remaining thickness of the semiconductor wafer at the groove after the groove cutting step, and calculation of the depth of the grooves by subtracting the remaining thickness from the full thickness.

3. The semiconductor wafer dividing method of claim 2, wherein the measurement of the full thickness of the semiconductor wafer is made by back pressure measuring means.

4. The semiconductor wafer dividing method of claim 2, wherein the measurement of the remaining thickness of the semiconductor wafer at the groove is made by laser light reflection measuring means.

5. The semiconductor wafer dividing method of claim 1, wherein a tape application step of applying a protective tape onto the face of the semiconductor wafer is incorporated after the groove cutting step and the groove depth measuring step.

* * * * *